United States Patent [19]
Grinberg et al.

[11] Patent Number: 5,389,788
[45] Date of Patent: Feb. 14, 1995

[54] INFRARED TRANSDUCER AND GOGGLES INCORPORATING THE SAME

[75] Inventors: Jan Grinberg, Los Angeles, Calif.; Raymond Balcerak, Alexandria, Va.; Chiung-Sheng Wu; Uzi Efron, both of Los Angeles, Calif.; Paul O. Braatz, Calabasas, Calif.

[73] Assignees: Hughes Aircraft Company, Los Angeles, Calif.; United States of America as represented by the secretary of the defense, Washington, D.C.

[21] Appl. No.: 166,790

[22] Filed: Dec. 13, 1993

[51] Int. Cl.⁶ .............................................. G02F 1/136
[52] U.S. Cl. .................................... 250/331; 250/332
[58] Field of Search .................. 250/331, 332, 334; 348/164

[56] References Cited

U.S. PATENT DOCUMENTS

| | | |
|---|---|---|
| 4,826,300 | 5/1989 | Efron et al. |
| 5,010,251 | 4/1991 | Grinberg et al. .......... 250/332 |
| 5,081,542 | 1/1992 | Efron et al. ............... 359/41 |
| 5,227,886 | 7/1993 | Efron et al. .............. 250/331 |

OTHER PUBLICATIONS

Schribner, "Infrared Focal Plane Array Technology", Proc. IEEE, vol. 79, 1991, pp. 66–85.
Efron et al., "The Silicon Liquid-Crystal Light Valve", Journal of Applied Physics, vol. 57, No. 4, 1985, pp. 1356–1368.
Efron, "Spatial Light Modulators and Applications for Optical Information Processing", Proc. of the SPIE, vol. 960, 1988, pp. 180–203.
Efron et al., "Liquid-crystal-based visible-to-infrared dynamic image converter", Optical Engineering, vol. 24, No. 1, 1985, pp. 111–118.
Welkowsky et al., "Status of the Hughes Charge-Coupled Device-Addressed Liquid Crystal Light Valve", Optical Engineering, vol. 26, No. 5, 1987, pp. 414–417.
Efron et al., "the Charged-Coupled-Device-Addressed Liquid Crystal Light Valve: An Update", Proc. of the SPIE, vol. 1455, 1991, pp. 237–247.

Primary Examiner—Carolyn E. Fields
Attorney, Agent, or Firm—V. D. Duraiswamy; W. K. Denson-Low

[57] ABSTRACT

An infrared (IR) radiation transducer integrates an IR detector array with a liquid crystal (LC) readout. The IR detector is preferably a pixelized bolometer array, but other detectors such as pyroelectric materials are possible. To modulate the LC in response to detected IR radiation, a modulating section is provided that includes a charge injection structure which injects electrical charge in response to the detected IR radiation, and a charge transfer structure that transfers the injected charge to the LC readout section. During its active phase the charge transfer layer is depleted of majority charge carriers, and the charge injection and transfer mechanism operates in a manner analogous to a bipolar transistor. A visible readout is obtained by directing readout light through the LC, where it is modulated in accordance with the detected IR image. The transducers are small and light weight enough to be incorporated into a pair of goggles, for which no separate cooling is required.

42 Claims, 6 Drawing Sheets

INFRARED TRANSDUCER AND GOGGLES INCORPORATING THE SAME

BACKGROUND OF THE INVENTION

1. Field of the Invention

This invention relates to infrared to visible optical radiation transducers, and more particularly to such transducers that are sufficiently compact and light weight to be incorporated into goggles.

2. Description of the Related Art

An infrared (IR) vision capability is very useful for night vision and other low visibility conditions, such as fog or dust. Most available night vision goggles are large and heavy, and operate with a CRT type display that requires a relatively large amount of power and high voltage. These devices cannot operate under totally dark conditions, such as cloudy nights, since they are based upon light amplification. They are also not very useful under low visibility conditions such as fog, since they are limited to the detection of the visible portion of the spectrum. IR sensitive goggles would overcome these limitations, since they would not require an active illumination source such as star light, and IR radiation is capable of penetrating air turbulence and fog with a significantly reduced scattering.

While several types of IR imagers have been developed, they are not easily incorporated into a head mounted display system. They generally involve a narrow bandgap semiconductor material such as HgCdTe, which must be cooled to prevent it from becoming too conductive at room temperature. Cooling, however, results in a relatively large size and weight requirement and a significant power consumption that is impractical for goggles. Pyroelectric IR detectors and bolometers have also been developed recently that provide an electrical output in response to an IR input. Pyroelectric materials include potassium tantalate niobate, barium strontium titanate, lead zirconate titanate, triglycine sulfate, lead titanate and lithium tantalate, while bolometer arrays are described in U.S. Pat. No. 5,010,251, issued on Apr. 23, 1991 to Grinberg et al. and assigned to Hughes Aircraft Company, the assignee of the present invention. To transfer the IR image from such a sensor array to a separate visible display, a complicated matrix-scanning readout circuit has previously been required. Since the signal generated in uncooled thermal detectors is relatively low, a pixel-amplifier array is also normally needed in the readout scheme. The matrix-scanning technique is described in Scribner, "Infrared Focal Plane Array Technology", *Proc. IEEE*, Vol. 79, 1991, pages 66–85. Unfortunately, the complicated readout circuitry tends to degrade the yield and to reduce the reliability of such uncooled IR focal plane arrays.

Outside the field of IR detection, protective goggles have been developed to protect the wearer from intense radiation. Such goggles, described in U.S. Pat. No. 5,081,542, issued Jan. 14, 1992 to Efron et al. and also assigned to Hughes Aircraft Company, employ a liquid crystal light valve (LCLV) to provide an image of a scene. The goggles respond to input radiation in the visible to near infrared range to modulate a visible optical readout. Lasers or other high intensity radiation sources are rejected by absorbing their energy in the LCLV's photoconductive layer, thereby protecting the wearer's eyes.

The basic LCLV mechanism is described in Efron et al., "The Silicon Liquid-Crystal Light Valve", *Journal of Applied Physics*, Vol. 57, No. 4, 1985, pages 1356–1368. It employs a bulk photosensitive layer that converts an optical image into a two-dimensional photogenerated charge pattern, which is transferred through the photosensitive layer to activate a thin liquid crystal (LC) layer. An output image that replicates the input image is generated by modulating an independent light source with the LC layer. Since the input and output images are isolated from each other, various optical functions such as optical amplification, optical limiting, wavelength conversion and incoherent-to-coherent image conversion can be performed, as described in Efron, "Real-Time Signal Processing for Industrial Applications", *Proc. of the SPIE*, Vol. 960, 1988, pages 180–203. The LCLV has been used as a high intensity, high resolution, large screen projector display, and also for visible-to-IR image conversion (see Efron et al., "Liquid-crystal-based visible-to-infrared dynamic image converter", *Optical Engineering*, Vol. 24, No. 1, 1985, pages 111–118). An electrically addressed LCLV has also been developed in which a charge coupled device (CCD) array replaces the photoactive array on the input side of the light valve. The CCD-LCLV is described in Welkowsky et al., "Status of the Hughes Charge-Coupled Device-Addressed Liquid Crystal Light Valve", *Optical Engineering*, Vol. 26, No. 5, 1987, pages 414–417, and in Efron et al, "The Charged-Coupled-Device-Addressed Liquid Crystal Light Valve: An Update", *Proc. of the SPIE*, Vol. 1455, 1991, pages 237–247. Unfortunately, none of these LCLV devices has an IR detection capability.

SUMMARY OF THE INVENTION

The present invention seeks to provide an IR detector that provides a visible output from an input IR image, and is compact and light enough to be incorporated into a comfortable goggles configuration. To accomplish this, the detector should be capable of operating without the need for cooling.

These goals are achieved by integrating an IR detector array into an LCLV, in which a modulating structure interfaces between the detector array and an LC readout section to modulate the readout in accordance with detected IR. The modulating structure includes a charge injection structure, preferably in the form of a doped semiconductor layer with an array of oppositely doped charge islands that form diode junctions with the semiconductor layer, and a charge transfer structure that transfers injected charge to the LC readout section to modulate the LC readout.

The IR detector array applies a signal voltage to the charge islands in response to detected IR radiation to forward bias the diode junctions, and thereby inject charge from the charge islands into the charge injection layer. The charge transfer structure preferably comprises a lightly doped semiconductor charge transfer layer of the same doping conductivity as the charge injection layer, and disposed between the charge injection layer and the LC readout section. A bias circuit applies a voltage that depletes the charge transfer layer of majority charge carriers, and sweeps injected charge across the charge transfer layer to modulate the LC readout. Although both conductivity types are possible, the charge islands, charge injection layer and charge transfer layer are preferably doped $n^+$, p and $p^-$, respectively, within respective doping concentration ranges of about $10^{17}$–$10^{19}$, $10^{15}$–$10^{16}$ and $10^{11}$–$10^{13}$/cm$^3$.

IR detection is preferably accomplished with a bolometer array in which each bolometer includes reference and IR sensing resistors, with the sensing resistor exposed and responding to incident IR radiation. To provide self-amplification of the current swept through the charge transfer layer, the modulating structure can be implemented as an MOS transistor, with a connection between the reference and IR sensing resistors functioning as the transistor gate. An array of pyroelectric materials can also be used as an alternate to the bolometer array.

Possible enhancements include the provision of a chopper that provides an AC voltage output from the IR detector array, with a DC block that inhibits the LC readout modulation from responding to DC voltage offsets in the detector array, and an edge lit readout that operates upon a light scattering principle from the LC cell.

These and other features and advantages of the invention will be apparent to those skilled in the art from the following detailed description, taken together with the accompanying drawings.

DETAILED DESCRIPTION OF THE INVENTION

Figure 1:
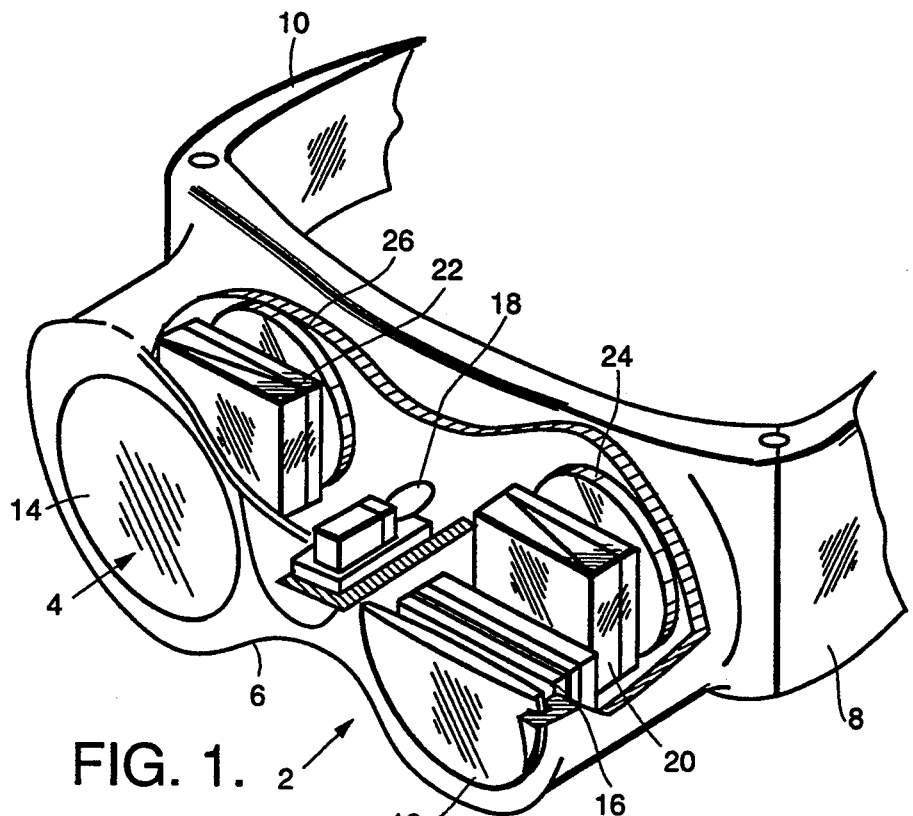
FIG. 1 is a partially cut away perspective view of a pair of IR goggles incorporating the invention.

A pair of goggles which incorporate the compact IR imaging capability of the present invention is shown in FIG. 1. The left and right goggles 2 and 4 are encased within a frame 6 that is constructed of plastic or other suitable material. A pair of straps 8 and 10 are provided to retain the goggles in a proper viewing position in front of the wearer's eyes. The goggles include respective objective lenses 12 and 14 which image an input IR scene onto IR detectors that are constructed in accordance with the invention (only the detector 16 for the left hand goggle 2 is shown, but a similar detector is employed behind the right hand goggle 4). To read out the input IR pattern from the detectors, a light emitting diode (LED) 18 directs visible light onto polarizing beam splitters (PBS) 20 and 22 located behind the IR detectors. This light is redirected by each PBS onto the rear of its respective IR detector, which modulates the optical readout beam so that it assumes the input IR image pattern, and reflects the beam back through the PBS so that it is seen by the wearer's left and right eyes. Since the IR input optics invert the image, lenses 24 and 26 are positioned in the path of the modulated readout beam to restore the output image to the original input orientation.

Figure 2:
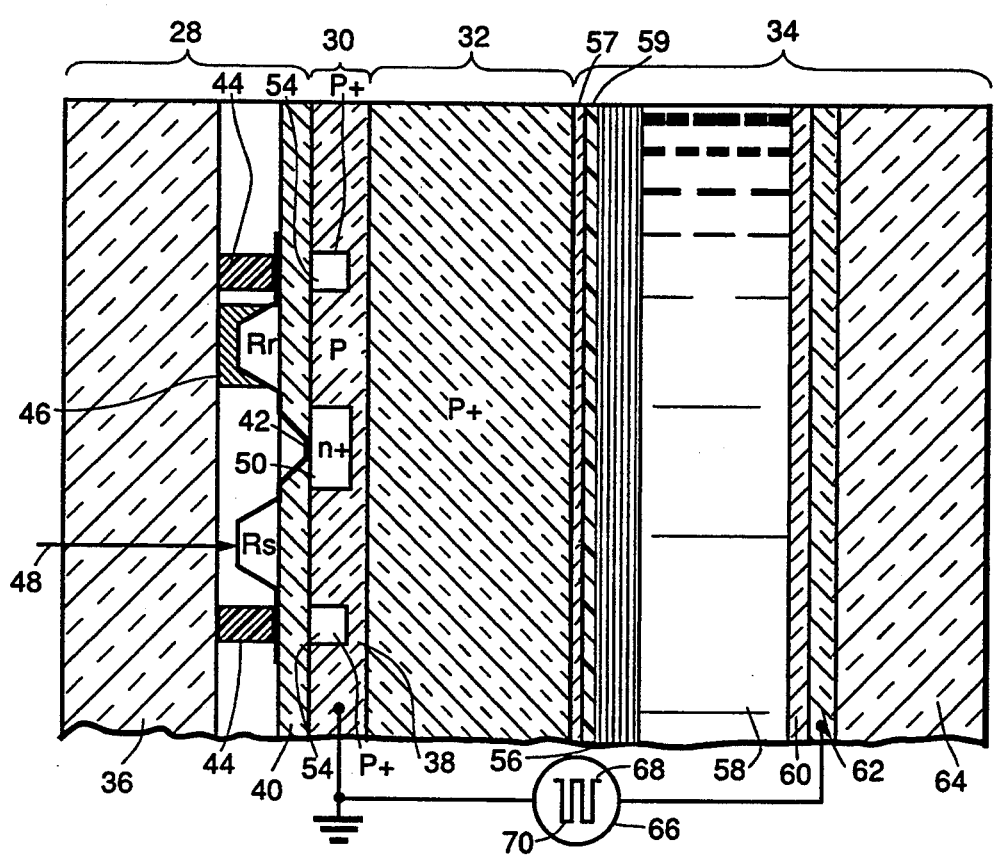
FIG. 2 is a sectional view of a portion of an integrated IR detector array and LC readout in accordance with the invention.

FIG. 2 shows one embodiment of an IR detection/optical readout mechanism that can be used for the IR goggles. It consists of four main sections: an IR detection section 28 that detects incoming IR on a pixelized basis and develops voltages based upon the IR intensity, a charge injection section 30 that injects an electrical charge under the control of the IR detection section, a charge transfer section 32 and an LC readout section 34. The charge transfer section transfers charge from the charge injection section to the LC readout section to modulate the optical readout from the overall device.

The IR detection section includes a protective window 36 that is formed from an IR-transparent material such as silicon or germanium, and an IR detector in the form of a bolometer having an IR sensing resistor bridge Rs connected in series with a reference resistor bridge Rr. This type of bolometer and the resistance bridge structures are described in U.S. Pat. No. 5,010,251, the contents of which are incorporated herein by reference. The resistor bridges are spaced from a doped silicon epitaxial layer 38, which forms part of the charge injection section, by a dielectric field oxide layer 40, preferably silicon dioxide. An electrical junction between the bolometer resistors Rs and Rr is established through a via 42 that extends through the dielectric layer 40 to contact the charge injection layer. Dielectric spacers 44, preferably about 3 microns long, separate the window 36 from the dielectric layer 40 to provide clearance for the resistor bridges.

When an IR-sensitive resistor structure is used the reference resistor Rr is masked from the incoming IR radiation by an IR-opaque coating 46 such as a metal film reflector that is held on with a non-conductive adhesive. This coating is reflective to prevent IR radiation from reaching the reference resistor Rr; the sense resistor Rs on the other hand is exposed to input IR radiation, represented by ray 48. If, on the other hand, the resistor bridges are formed from a material such as amorphous silicon that is insensitive to the IR radiation, both resistors Rs and Rr can be exposed to the incoming IR radiation. The sense resistor Rs in this case would be coated with an IR absorbent material such as metallic black that is held on with a non-conductive adhesive.

While only one detector pixel is shown in the figure, an array of similar detectors are provided on a pixelized basis. Other types of IR detectors that provide an electrical response to an IR input, such as pyroelectric materials and thermopiles, could also be used, but bolometer circuits are preferred.

The epitaxial silicon charge injection layer 38 is doped, preferably p type, while the charge transfer layer 32 is more lightly doped to the same conductivity, preferably p−. An oppositely doped charge island 50, n+ in the preferred embodiment, is provided in the charge injection layer and is contacted by the conductive via 42 that connects the two bolometer resistors. This charge island provides a source of charge that is used to modulate the readout section within each pixel in response to incident IR.

The silicon charge transfer substrate 32 is preferably about 125 microns thick, with a doping concentration of about $10^{11}$–$10^{13}$/cm$^3$. The charge injection epitaxy layer 38 should be thin, on the order of 5–10 microns, to enhance the charge transfer efficiency, and relatively defect free. It is preferably doped to a concentration of about $10^{15}$–$10^{16}$/cm$^3$, while the n+ charge islands preferably have a doping concentration of about $10^{17}$–$10^{19}$/cm$^3$. The resistivity of the epitaxy layer is preferably about 1–10 ohm-cm; the charge transfer layer 32 has a much higher resistivity preferably on the order of 10k ohm-cm. The bolometer resistors Rs and Rr are directly integrated on the field oxide 40 over the charge injection structure. The junction 52 between the n+ charge island 50 and the p-type charge injection epitaxial layer 38 forms a diode that is forward biased in response to IR radiation striking the sense resistor Rs, and thereby injects charge from the charge island into the charge injection layer.

Because of the finite resistance of the epitaxy layer 38, a grounded p+ channel 54 that surrounds the charge injection diode may be used to ensure continuous charge injection operation. This p+ channel on the p-type epitaxy layer also helps to isolate cross-talk between the injection diodes of adjacent pixels. Both the n+ charge island 50 and the p+ channel 54 can be fabricated by precision ion implantation.

Beginning at the edge of the charge transfer layer 32, the readout section 34 consists of a dielectric mirror 56 which preferably includes a thin (about 1 micron) gate oxide layer 57 adjacent the silicon substrate 32 and a CdTe light blocking layer 59 adjacent the gate oxide, a nematic liquid crystal cell 58 with silicon dioxide alignment layers 60, an indium-tin-oxide transparent electrode 62, and a glass plate 64 which serves as part of the container for the liquid crystal. With the relatively low power LED employed for the optical readout, the dielectric layer 56 need only be about a 1–3 pair structure, preferably Si/SiO$_2$.

In operation, a pulsed voltage source 66 is connected between the charge injection layer 38 and the ITO electrode 62, with layer 38 grounded and alternate positive and negative voltage pulses applied to the electrode 62. The positive voltage pulses 68 are typically +20 volts, while the negative voltage pulses 70 are shorter in duration and are typically −40 volts. A typical pulse frequency is 4–5 KHz, with more than 90% of each cycle preferably devoted to the positive pulse. The device alternates between active phases during the positive voltage pulses, and refresh phases during the negative pulses. During the active phases, the p− silicon wafer 32 is essentially fully depleted of majority charge carriers. The depletion region spreads easily in the high resistivity silicon wafer 32, but is abruptly stopped at the edge of the much lower resistivity charge injection layer 38, which remains mostly undepleted and conductive.

Absorption of an input IR image by the bolometer detector heats the sense resistor Rs relative to the reference resistor Rr; the heating of Rs modifies its resistance. Since the bolometer is configured as a zero-offset voltage divider, the resistance imbalance generates a negative voltage signal at the junction of Rs and Rr, which signal is applied to the n+ island 50. This signal voltage forward biases the diode junction 52, increasing the injection of electrons from the n+ charge island 50 to the p-type charge injection layer 38, where the injected electrons are now minority carriers. The great majority of these carriers (typically about 99%) diffuse through the thin epitaxial layer to the thick, fully depleted p− charge transfer layer 32. Upon reaching the interface between the epitaxial layer 30 and the charge transfer layer 32, the minority carriers are swept across the charge transfer layer and transferred to the silicon-dielectric mirror interface by the depletion region field; this process occurs with a high degree of spatial resolution, typically about 10 microns. The current which results from this charge transport then activates the liquid crystal. Activation of the LC induces a refractive index image in the LC that corresponds to the input IR image. This image is read out with a visible optical readout beam; alternate readout configurations are described below.

During this process, electrons accumulate at the interface between the silicon substrate 32 and the dielectric mirror 56. A recombination of these electrons occurs during the brief inactive (accumulation) phase 70 of the power supply. During the accumulation phase, holes are injected from the conductive epitaxial layer 38 to the silicon-dielectric interface to recombine with the electrons that have accumulated there.

The operation of the charge injection and charge transfer sections 30 and 32 in modulating the LC readout is similar to the operation of a bipolar transistor. The n+ charge island 50 functions in a manner similar to the emitter of an npn transistor, with the charge injection layer 30 functioning as the base and the charge transfer layer 32 as the collector (although layer 32 is doped p− rather than n, for purposes of analogy it can be considered to be n doped relative to the more heavily p doped charge injection layer 30). In response to input IR radiation, a negative voltage is applied by the bolometer to the "emitter" 50, which establishes a positive "base-emitter" voltage that allows for a "collector-emitter" current flow. Instead of the "npn" transistor shown, a "pnp" transistor could be implemented by reversing the conductivities of the charge transfer layer 32, charge injection layer 38 and charge island 50. However, a better operation is achieved with the conductivity shown in FIG. 2 because electrons have a higher mobility in silicon than do holes.

Figure 3:
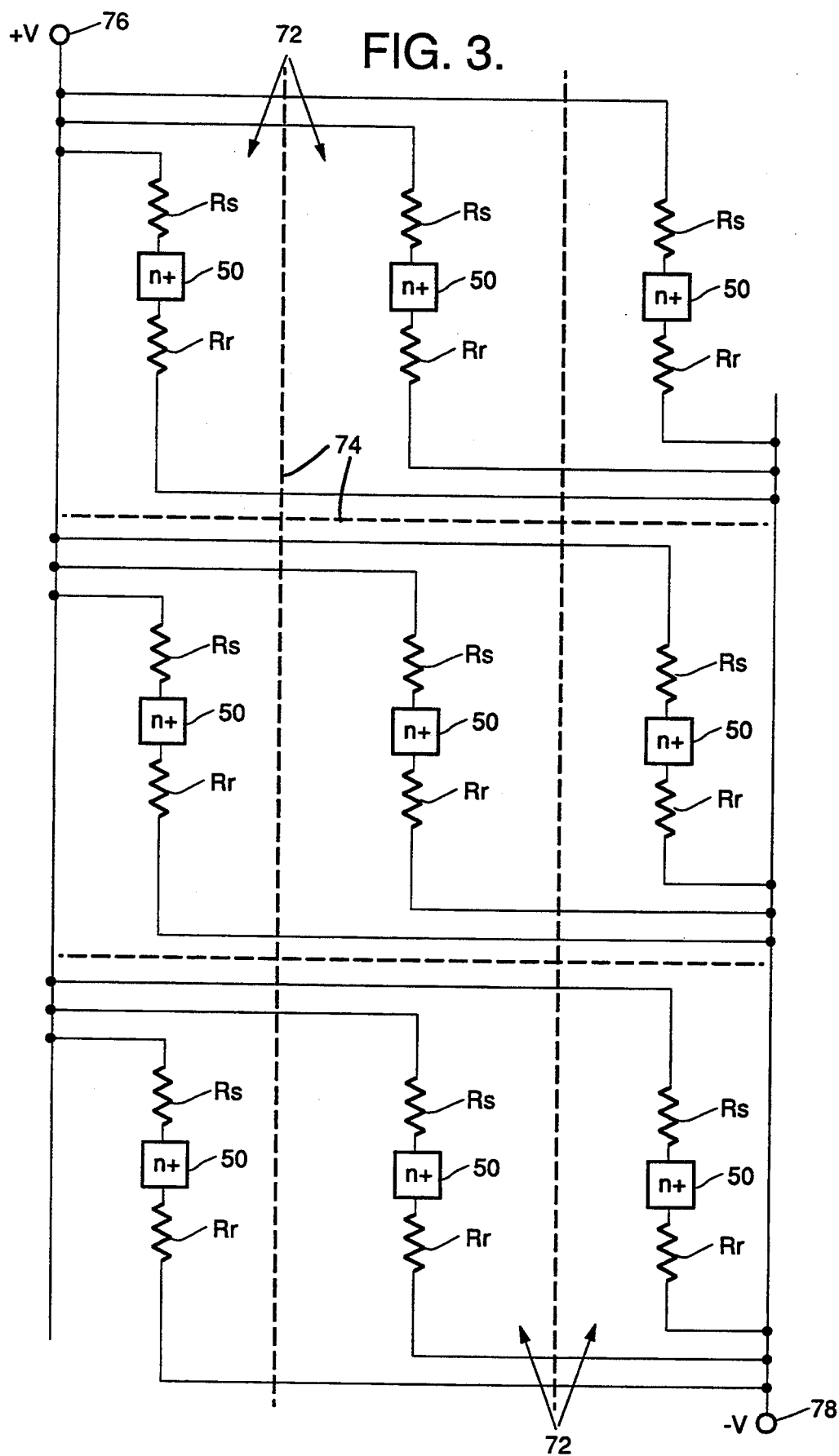
FIG. 3 is a schematic diagram of a portion of the IR detector array used in the structure of FIG. 2.

The geometric layout and electrical connections for an array of IR detectors is illustrated in FIG. 3. Each pixel 72 includes a sense resistor Rs and reference resistor Rr as shown in FIG. 2, with a charge island 50 connected between the two resistors. Although only nine pixels are shown, many more would be employed for a practical device. Pixel sizes of 50 micrometers are attainable, and an even higher resolution is expected in the future. The pixel boundaries 74 would generally correspond to the p+ channels 54 when these are used. The sense and reference resistors Rs and Rr are connected respectively to positive and negative voltage nodes 76 and 78, at the far ends of the resistors from the charge islands 50. The positive and negative voltages can be from about 5 to 50 volts, with bias voltages towards the lower end of this range being preferred. Since the sense and reference resistors are fabricated by the same process, preferably to identical nominal values, variations in the value of one resistor will tend to be matched by equal variations in the value of the other resistor.

Figure 4:
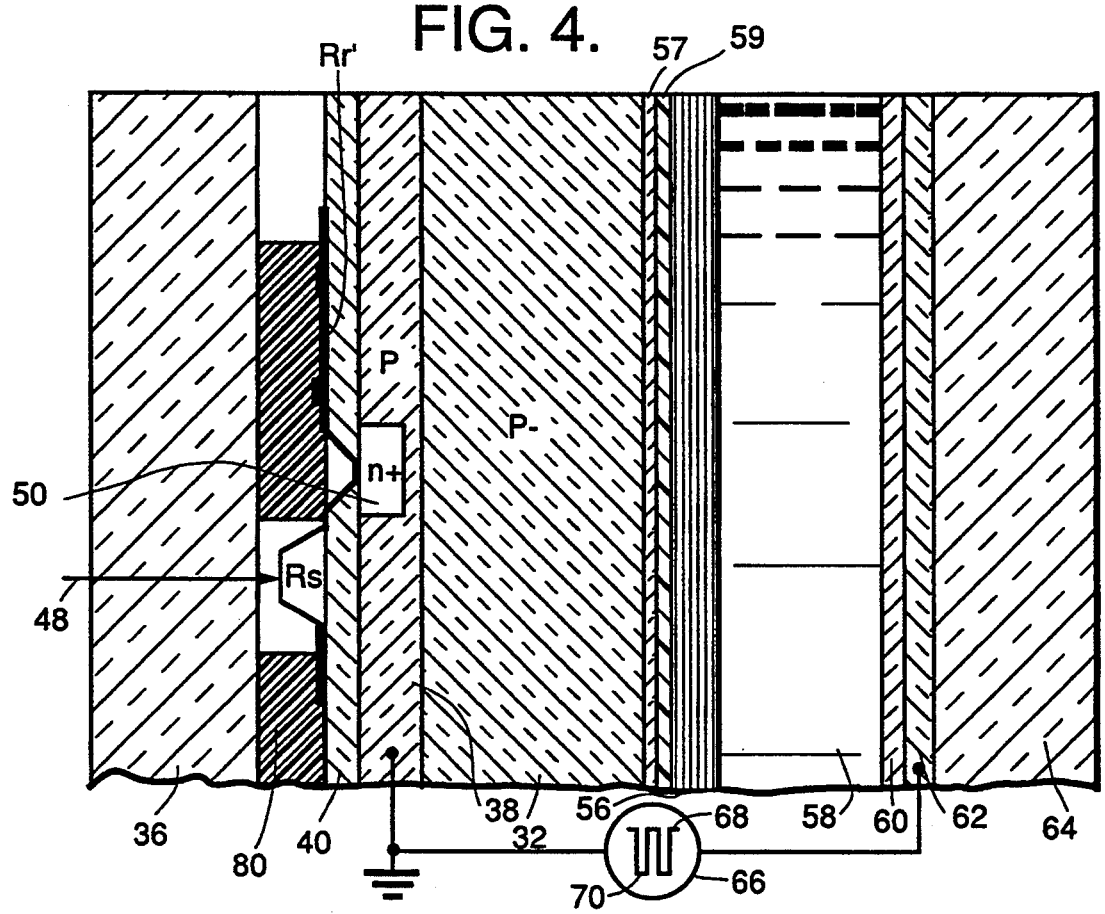
FIG. 4 is a sectional view of a variation on the FIG. 2 IR detection scheme, with a modified IR detector element.

Referring now to FIG. 4, a variation in the structure of the bolometer reference resistors is shown. Elements that are common to those shown in FIG. 2 are indicated by the same reference numbers. In FIG. 4, the reference resistor Rr' is formed as a thin film directly on the surface of the dielectric layer 40. A dielectric coating 80 serves as a spacer to provide solid support for the wafer on the IR window 36. Additional savings in space can be achieved by fabricating the reference resistor Rr directly below, and shaded by, the sense resistor Rs.

Resistors Rs and Rr' are preferably formed from the same material so that a variation in one, due to temperature or fabrication fluctuations, is matched by a corresponding change in the other. In this case the coating 80 would be opaque to IR so as to mask Rr' (although it need not be opaque if the substrate which includes the oxide layer 40 provide enough heat sinking action to keep the temperatures of Rs and Rr' equal). If Rr' is formed from a different material than Rs and is non-sensitive to IR radiation, layer 80 need not be opaque to IR.

Figure 5:
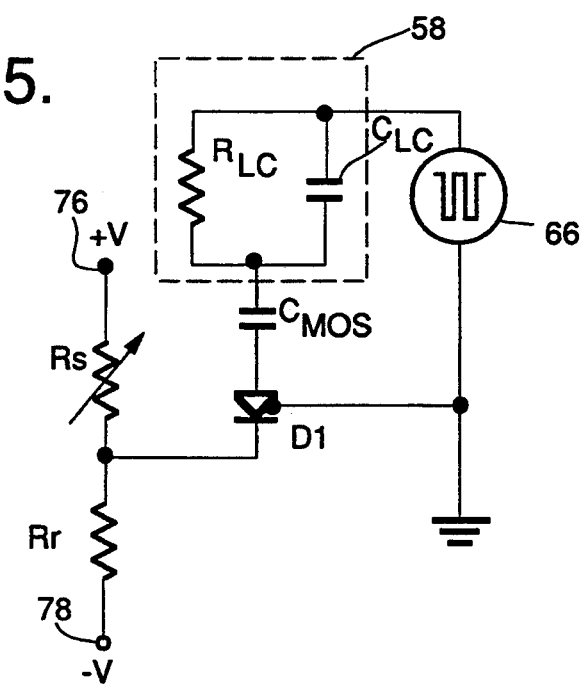
FIG. 5 is a schematic diagram illustrating the electrical operation of the IR imaging devices of FIGS. 2 and 4.

An equivalent circuit for the detectors of both FIGS. 2 and 4 is given in FIG. 5. The liquid crystal cell 58 can be represented as a parallel resistor ($R_{LC}$)-capacitor ($C_{LC}$) circuit; the metal-oxide-semiconductor sequence of ITO layer 62, oxide layer 60 and semiconductor layers 32 and 38 as a capacitor $C_{MOS}$; and the charge injection layer 38/charge island 50 junction 52 as a diode D1. The RC circuit 58, capacitor $C_{MOS}$ and diode D1 are connected in series between the power supply 66 and the juncture of the bolometer resistors.

Figure 6:
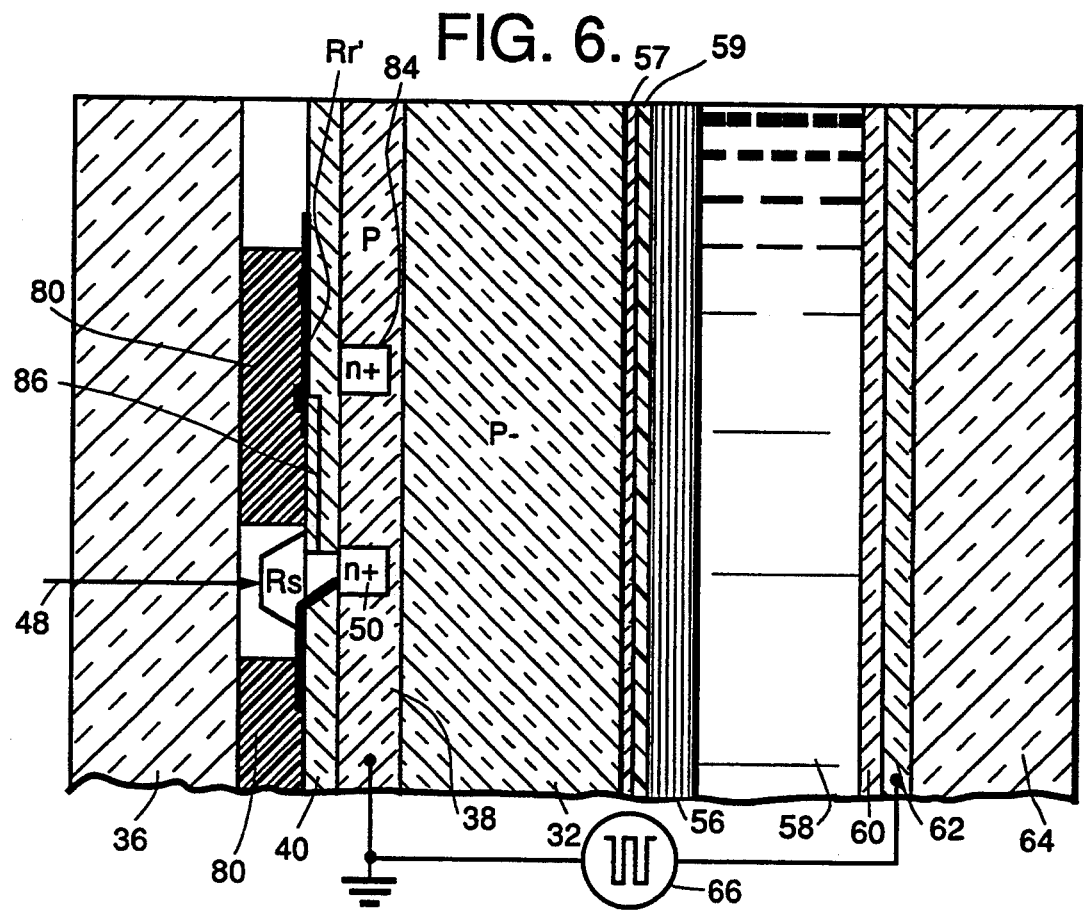
FIG. 6 is a sectional view of a portion of another integrated IR detector and LC readout device, with a built-in amplification mechanism.
Figure 7:
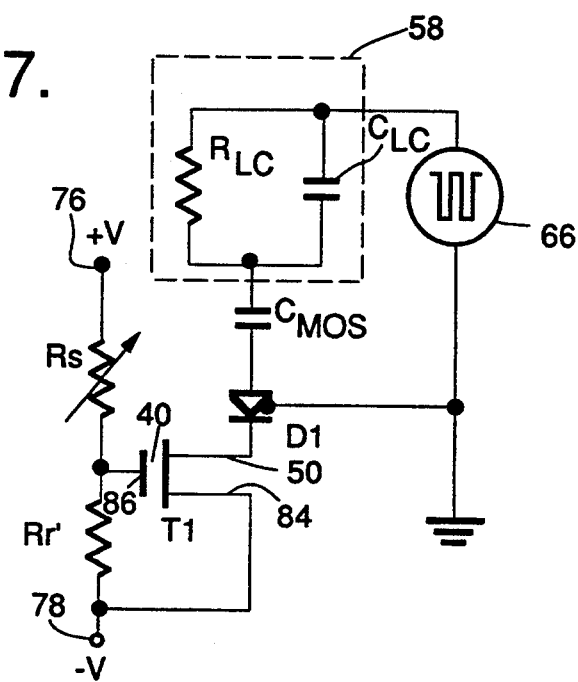
FIG. 7 is a schematic diagram illustrating the electrical operation of the FIG. 6 device.

FIG. 6 shows another embodiment that is similar to the embodiment of FIG. 4, but with the addition of another n+ charge island 84 in the epitaxial layer 38, opposite the reference resistor Rr'. The two resistors Rs and Rr' are connected by a metallic strip 86 that is set into the dielectric layer 40. This configuration provides an internal amplification capability, in which the charge islands 84 and 50 function respectively as the source and drain of an MOS transistor, metal strip 86 functions as the gate, the portion of the epitaxial layer between charge islands 84 and 50 functions as the channel and the portion of the dielectric oxide layer 40 between the metal strip 86 and the epitaxial layer 38 functions as the gate insulation. The electrical connections and equivalent circuit are given in FIG. 7, in which the various elements of the MOS transistor T1 are identified by the reference numbers used in the structural drawing of FIG. 6. By connecting the source charge island 84 to the negative voltage node 78, the bolometer voltage established between Rr' and Rs modulates the transistor gate voltage, which in turn controls the current flow through the diode D1 and thus the current through the depleted charge transfer region 32.

Figure 8:
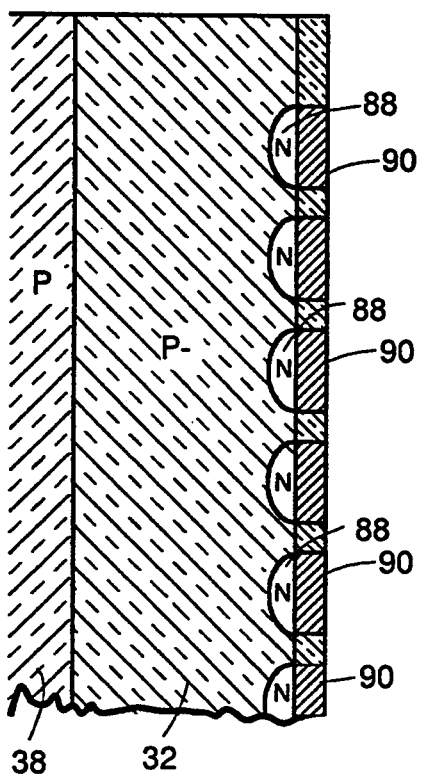
FIGS. 8 and 9 are sectional views showing two possible variations on the LC modulation structure.
Figure 9:
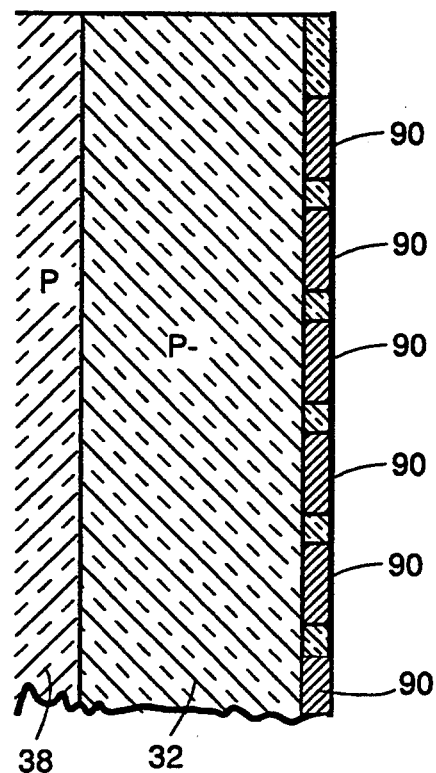

As described thus far, a pulsed AC power supply 66 is required to prevent the creation of an inversion layer at the silicon substrate 32/dielectric mirror 56 interface. However, this approach does not work well with certain perpendicular aligned liquid crystals. A DC power supply can be used if either a p-n diode or a series of Shottky diodes are established at the interface. The portion of an IR detector which incorporates the p-n diode variation is illustrated in FIG. 8. N doped islands 88 are implanted into the p⁻ charge transfer layer 32 and overcoated with a metal-matrix-mirror (90) to provide ohmic contact to the individual diode N region and to provide a conductive mirror so that the diodes can be DC biased. The charge transfer layer 32 is depleted with a DC power supply that reverse biases the p-n junction 32/88. With the Shottky diode approach, illustrated in FIG. 9, an array of metal pads constituting metal matrix mirror 90 are substituted for the dielectric mirror 56 to reflect an optical readout beam. The pads 90 collectively form a metal matrix mirror, as disclosed in U.S. Pat. No. 4,826,300, issued on May 2, 1989 to Efron et al and assigned to Hughes Aircraft Company. One pad is provided per pixel, and the spaces between adjacent pads can be filled with an opaque non-conductive material to prevent light leakage from the liquid crystal cell into the charge transfer layer. Alternately, a dielectric mirror can be used alongside the metal matrix mirror to prevent light leakage. The interfaces between the metal pads 90 and p⁻ doped charge transfer layer 32 establish Shottky barrier diode junctions that also allow for a DC power supply. The use of a simple DC bias will generally improve both spatial resolution and sensitivity, although certain liquid crystals are known to be damaged under the application of a continuous DC voltage, and such LCs should not be used with either the p-n or Shottky diode embodiments in a DC voltage operation.

Figure 10:
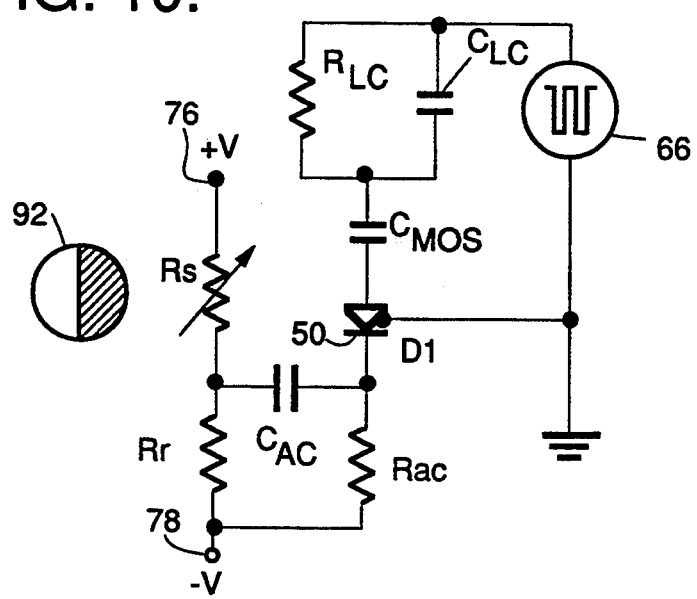
FIG. 10 is a schematic diagram illustrating the use of a chopper to eliminate DC offsets from the readout.

In case of a fabrication non-uniformity that results in an imbalance between the sense and reference resistors Rs and Rr, a DC offset voltage can be established at the n+ charge island 50. A solution to this is illustrated in FIG. 10, in which a chopper 92 (either mechanical or electrical) is added to produce an AC voltage output from the IR detector in the presence of incident IR radiation. An AC coupling of the bolometer bridge to the diode D1 is established by adding a capacitor $C_{AC}$ between the diode's cathode (charge island 50) and the juncture of Rs and Rr, and a resistor Rac between the diode's cathode and the negative voltage node 78. The offset voltage caused by the imbalance in the bolometer bridge is blocked from the LC readout section by the AC coupling circuitry.

Figure 11:
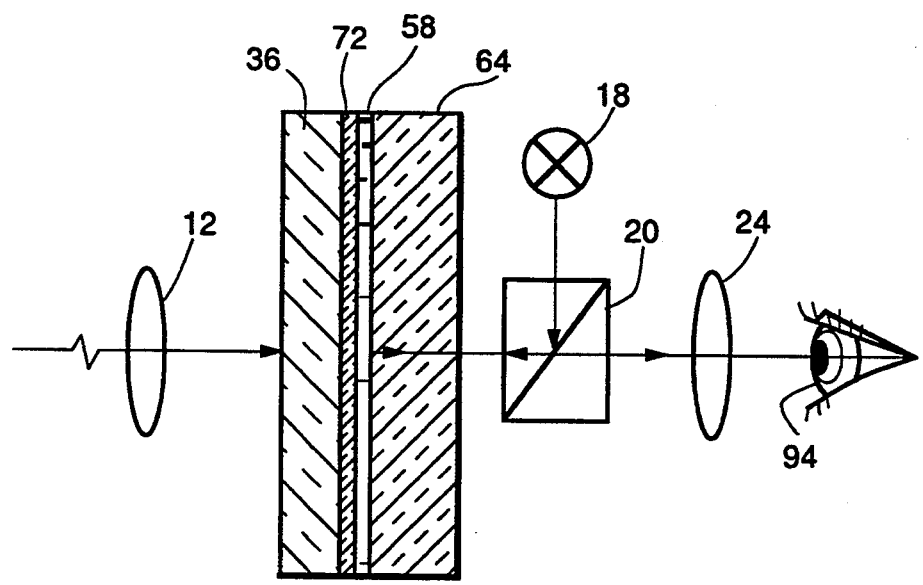
FIGS. 11 and 12 are diagrams illustrating optical readouts that can be obtained with a polarized beam splitter, and with edge lighting of the LC cell, respectively.

One optical readout configuration is illustrated in FIG. 11, in which the IR transducer structure is simplified to show only the input cover plate 36, the array of IR detection pixels 72, the LC cell 58 and the readout cover plate 64. The readout mechanism corresponds to that shown in FIG. 1 for the IR goggles, with the polarizing beam splitter 20 redirecting light from the LED 18 onto the LC cell 58, and the modulated light reflected back through the cell and transmitted through the lens 24 to the viewer's eye 94.

Figure 12:
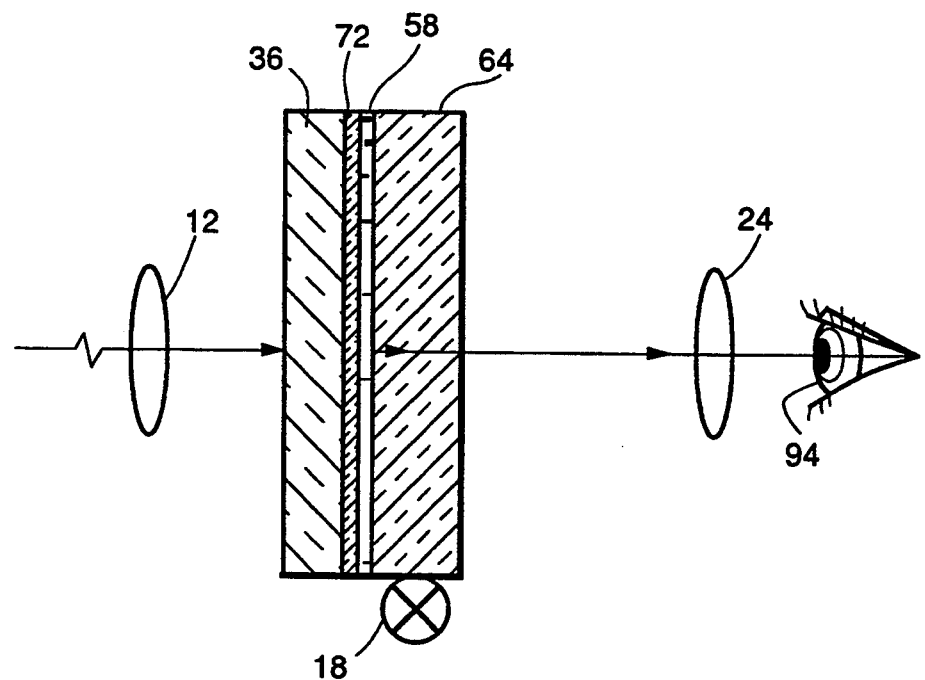

An alternate readout scheme that requires smaller, lighter and less expense readout optics is illustrated in FIG. 12. In this approach, a dynamic scattering mode instead of the usual field effect mode operation of the LC is used. The LED 18 is positioned to provide edge lighting for the readout cover plate 64, and is light-guided in the glass plate. In the off state, no light is emitted to the viewer's eye, and a dark background is achieved. When the LC is activated in the scattering mode, light is scattered and collected by the lens 24 to the viewer's eye, displaying a white image on a black background. This approach eliminates both the polarizing cube 20 and a collimating lens that is normally used for the LED, resulting in reductions in cost, size and weight. It also allows the readout lens 24 to be positioned closer to the LC, thereby further reducing the size.

Another readout variation is an optical configuration that is the same as the one shown in FIG. 11, but with a thicker LC layer (6–12 microns vs. the conventional 4 micron LC thickness). When activated, the thicker LC layer will transmit different colors for different activation levels. The colors are white and blue for low activation, and green, yellow and magenta for higher activation. This makes it possible to color code the temperatures in the input IR image without adding complexity to the detector or readout structure.

The described IR-to-visible radiation transducer is small and light weight enough to be comfortably manufactured into a pair of goggles. A battery is required for the charge depletion power supply, the bolometer voltage nodes and the LED. However, the total power required is quite low. It has been calculated that the bolometers are capable of generating currents in the liquid crystals that correspond to a temperature range of 0.1° C.–18.75° C. (above ambient), with a total power requirement of only 0.25 W.

The prior need for a matrix-scanning readout, a cooling mechanism, a pixel array amplifier and a separate sensor and display has been eliminated. Noise in the system is reduced by minimizing the bandwidth of the system to the frame time; this is accomplished automatically by the inherent limited response speed of the LC. Since each IR detector element is constantly connected to a corresponding LC pixel, as opposed to the prior scanning/sampling technique, a duty cycle in excess of 90% is achieved for the display; this provides a high efficiency and elimination of flicker. Each pixel is independent of the others, resulting in a high yield and low cost.

While several illustrative embodiments of the invention have been shown and described, numerous variations and alternate embodiments will occur to those skilled in the art. Such variations and alternate embodiments are contemplated, and can be made without departing the spirit and scope of the invention as defined in the appended claims.

We claim:

1. An infrared (IR) radiation transducer, comprising:
    an IR detector,
    a liquid crystal (LC) readout section, and
    a modulating structure interfacing between said IR detector and said LC readout section to modulate the LC readout in accordance with detected IR.

2. The IR radiation transducer of claim 1, wherein said IR detector, LC readout section and modulating structure are integrated with each other in a common integrated structure.

3. The IR radiation transducer of claim 1, said transducer having no active self-cooling capability.

4. The IR radiation transducer of claim 1, said modulating structure including a charge injection structure for injecting electrical charge in response to the detection of IR radiation by said IR detector, and a charge transfer structure for transferring injected charge from said charge injection structure to said LC readout section to modulate the LC readout.

5. The IR radiation transducer of claim 4, said charge injection structure comprising a doped semiconductor charge injection layer and an oppositely doped charge island forming a diode junction with said charge injection layer, said IR detector applying a voltage to said charge island in response to detected IR radiation to forward bias said diode junction and inject charge from said charge island into said charge injection layer.

6. The IR radiation transducer of claim 5, said charge transfer structure comprising a lightly doped semiconductor charge transfer layer of the same doping conductivity as said charge injection layer and disposed between said charge injection layer and said LC readout section, and a circuit for applying a bias voltage to deplete said charge transfer layer of charge carriers and sweep charge injected into the charge injection layer across the charge transfer layer to modulate the LC readout.

7. The IR radiation transducer of claim 6, wherein said charge island, charge injection layer and charge transfer layer are respectively doped $n^+$, p and $p^-$.

8. The IR radiation transducer of claim 7, wherein the doping concentrations of said charge island, charge injection layer and charge transfer layer are respectively within the approximate ranges of $10^{17}$–$10^{19}$, $10^{15}$–$10^{16}$ and $10^{11}$–$10^{13}$/cm$^3$.

9. The IR radiation transducer of claim 5, further comprising a highly doped channel of the same conductivity as said charge injection layer surrounding said diode junction.

10. The IR radiation transducer of claim 1, said IR detector comprising a bolometer having reference and IR sensing resistors, with the sensing resistor responding and the reference resistor not responding to input IR radiation.

11. The IR radiation transducer of claim 10, said reference and IR sensing resistors comprising respective IR absorbing resistor bridge structures, with an IR blocking material on the reference resistor bridge structure.

12. The IR radiation transducer of claim 10, said IR sensing resistor comprising an IR absorbing resistor bridge structure, and said reference resistor comprising a thin film resistor shaded by an IR blocking structure.

13. The IR radiation transducer of claim 12, wherein said reference resistor is positioned under and shaded by said IR sensing resistor bridge structure.

14. The IR radiation transducer of claim 10, said modulating structure including the source, drain and channel of an MOS transistor connected to transmit a current through the modulating structure to modulate the LC, said reference and IR sensing resistors being connected by a metallic strip that functions as the gate of said MOS transistor for amplifying said current in accordance with a voltage developed between said reference and IR sensing resistors, said modulating structure further including an oxide dielectric layer between said gate strip and channel.

15. The IR radiation transducer of claim 1, said IR detector comprising a pyroelectric material that generates charge in response to incident IR.

16. The IR radiation transducer of claim 1, said modulating structure responding to a voltage from said IR detector to modulate said LC readout section, further comprising a chopper that produces an AC voltage output from the IR detector in response to incident IR radiation, and a DC block in the IR detector for inhibiting modulation of the LC readout section in response to a DC voltage offset in the detector.

17. The IR radiation transducer of claim 1, said LC readout section including an LC cell and an edge lit transparent cover plate for said LC cell, the LC in said cell scattering edge lighting from said cover plate into a transducer readout in response to modulation of the LC cell by said modulating structure.

18. Goggles for viewing an infrared (IR) scene, comprising:
    a pixelized array of IR detectors,
    a liquid crystal (LC) optical readout section providing a readout image to a person wearing the goggles, a modulating structure interfacing between said IR detector array and said LC readout section to modulate the LC readout on a pixelized basis in accordance with IR radiation detected by said detector array, said detector array, LC readout section and modulating structure being integrated with each other in a common integrated structure, and a support mechanism for retaining said common integrated structure on a person wearing the goggles so that the person can see its modulated optical readout.

19. The goggles of claim 18, said modulating structure including a charge injection structure for injecting patterns of electrical charges in response to the detection of IR radiation by said IR detectors, and a charge transfer structure for transferring charge injected by said charge injection structure to said LC readout section to modulate the LC readout.

20. The goggles of claim 19, said charge injection structure comprising a doped semiconductor charge injection layer and, for each of said IR detectors, a respective oppositely doped charge island forming a diode junction with said charge injection layer, said IR detectors applying voltages to their respective charge islands in response to detected IR radiation to forward bias said diode junctions and inject charge from said charge islands on a pixelized basis into said charge injection layer.

21. The goggles of claim 20, said charge transfer structure comprising a lightly doped semiconductor charge transfer layer of the same doping conductivity as said charge injection layer and disposed between said charge injection layer and said LC readout section, and a circuit for applying a bias voltage to deplete said charge transfer layer of charge carriers and sweep charge injected into the charge injection layer across the charge transfer layer to modulate the optical LC readout on a pixelized basis.

22. The goggles of claim 21, wherein said charge islands, charge injection layer and charge transfer layer are respectively doped $n+$, $p$ and $p-$.

23. The goggles of claim 22, wherein the doping concentrations of said charge islands, charge injection layer and charge transfer layer are respectively within the approximate ranges of $10^{17}$–$10^{19}$, $10^{15}$–$10^{16}$ and $10^{11}$–$10^{13}/cm^3$.

24. The goggles of claim 20, further comprising respective highly doped channels of the same conductivity as said charge injection layer surrounding each of said diode junctions.

25. The goggles of claim 18, said IR detector array comprising an array of bolometers having respective reference and IR sensing resistors, with the sensing resistor of each bolometer responding and the reference resistor not responding to input IR radiation.

26. The goggles of claim 25, said reference and IR sensing resistors comprising respective resistor bridge structures, with an IR blocking material on the reference resistor bridge structure being nonresponsive to input IR radiation.

27. The goggles of claim 25, said IR sensing resistors comprising resistor bridge structures, and said reference resistors comprising thin film resistors.

28. The goggles of claim 27, wherein the reference resistor of each bolometer is positioned under and shaded by the IR sensing resistor bridge structure of the same bolometer.

29. The goggles of claim 25, said modulating structure including, for at least some of the bolometers in said detector array, the source, drain and channel of an MOS transistor connected to transmit a current through the modulating structure to modulate the LC, said reference and IR sensing resistors being connected by a metallic strip that functions as the gate of said MOS transistor for amplifying said current in accordance with a voltage developed between said reference and IR sensing resistors, said modulating structure further including an oxide dielectric layer between said gate strip and channel.

30. The goggles of claim 18, said IR detector array comprising an array of pyroelectric detectors that generate charge in response to incident IR.

31. The goggles of claim 18, said modulating structure responding to a voltage pattern from said IR detector array to modulate said LC readout section, further comprising a chopper that produces AC voltage outputs from the IR detectors in response to incident IR radiation, and DC blocks for inhibiting modulation of the LC readout section in response to DC voltage offsets in said detectors.

32. The goggles of claim 18, said LC readout section including an LC cell and an edge lit transparent cover plate for said LC cell, the LC in said cell scattering edge lighting from said cover plate into a transducer readout in response to modulation of the LC cell by said modulating structure.

33. The goggles of claim 32, wherein said LC cell is edge lit by a light emitting diode.

34. The goggles of claim 18, further comprising a lens positioned to invert the readout image.

35. An infrared (IR) to optical radiation transducer, comprising:
a lightly doped semiconductor substrate,
a thin insulating layer formed on one side of the substrate,
a mirror formed on the insulating layer,
a liquid crystal cell formed on the mirror,
a first dielectric layer formed on the liquid crystal cell,
a transparent sheet electrode formed on the dielectric layer,
a more heavily doped layer of semiconductor material formed on the other side of the substrate and doped to the same conductivity as said substrate,
a pixelized array of doped islands in said semiconductor layer that are heavily doped to the opposite conductivity of said substrate,
an array of IR detectors formed over said semiconductor layer in correspondence with said island array, each of the IR detectors in said array generating a voltage in response to incident IR radiation,
an array of electrical connectors connecting the voltages generated by said IR detectors to respective doped islands, said islands injecting charge carriers into said semiconductor layer in response to voltages received from their respective IR detectors,
a voltage source for applying a voltage across said semiconductor layer and said electrode to transfer charge carriers injected into the semiconductor layer from said islands across the substrate to modulate the refractive index of the liquid crystal cell on a pixelized basis that corresponds to the island array, and
a light source for directing light through said liquid crystal to optically read out its modulation pattern.

36. The IR to optical radiation transducer of claim 35, further comprising a second dielectric layer between said semiconductor layer and said IR detectors, said electrical connectors extending through said second dielectric layer between their respective IR detectors and doped islands.

37. The IR to optical radiation transducer of claim 36, wherein said substrate, mirror, liquid crystal cell, first and second dielectric layers, sheet electrode, semiconductor layer, doped islands, IR detectors and electrical connectors are integrated with each other in a common integrated structure between an optically transparent window on the readout side of the transducer and an IR transparent window on the IR detector side.

38. The IR to optical radiation transducer of claim 35, wherein said islands, semiconductor layer and semiconductor substrate are respectively doped $n^+$, p and $p^-$.

39. The IR to optical radiation transducer of claim 38, wherein the doping concentrations of said islands, semiconductor layer and semiconductor substrate are respectively within the approximate ranges of $10^{17}$–$10^{19}$, $10^{15}$–$10^{16}$ and $10^{11}$–$10^{13}$/cm$^3$.

40. The IR to optical radiation transducer of claim 35, wherein a transparent cover plate is provided over said transparent sheet electrode, said light source is disposed to provide edge lighting for said cover plate, with the liquid crystal in said cell scattering edge lighting from said cover plate into a transducer readout in response to the cell's modulation.

41. The IR to optical radiation transducer of claim 35, wherein said IR detectors comprise respective bolometers, each bolometer including a reference resistor that is nonresponsive to incident IR radiation and is connected in series with an IR sensing resistor between positive and negative voltage nodes, said IR sensing resistor being exposed to incident IR radiation.

42. The IR of optical radiation transducer of claim 41, wherein said second dielectric layer is formed from an oxide, and the reference and IR sensing resistors of said IR detectors are connected by respective metallic gate strips, each gate strip extending on one side of the doped island for its detector and separated by said oxide layer from the doped semiconductor layer, further comprising second respective heavily doped islands in said semiconductor layer for said IR detectors of the same conductivity as the first doped islands, said second doped islands being on the opposite sides of their respective gate strips from their respective first islands and connected to the same voltage node as the sensing resistor, the gate strip, first and second doped islands and the intervening portions of the semiconductor and oxide layers for each detector collectively comprising an MOS transistor for amplifying the charge flow which modulates the liquid crystal.

* * * * *